United States Patent [19]

Gersbach et al.

[11] 4,302,823

[45] Nov. 24, 1981

[54] DIFFERENTIAL CHARGE SENSING SYSTEM

[75] Inventors: John E. Gersbach, Burlington; Ick W. Kim, Essex Junction; Adolf M. Zehle, North Hero, all of Vt.

[73] Assignee: International Business Machines Corp., Armonk, N.Y.

[21] Appl. No.: 108,243

[22] Filed: Dec. 27, 1979

[51] Int. Cl.$^3$ .................... G11C 7/00; G11C 11/40
[52] U.S. Cl. ........................... 365/190; 365/154
[58] Field of Search ................... 365/156, 190, 154

[56] References Cited

U.S. PATENT DOCUMENTS

| | | | |
|---|---|---|---|
| 3,736,477 | 5/1973 | Berger et al. | 307/303 |
| 3,815,106 | 6/1974 | Wiedmann | 365/156 |
| 3,816,758 | 6/1974 | Berger et al. | 307/214 |
| 3,863,229 | 1/1975 | Gersbach | 365/156 |
| 4,021,786 | 5/1977 | Peterson | 357/54 |
| 4,027,176 | 5/1977 | Heuber et al. | 307/355 |
| 4,032,902 | 6/1977 | Herndon | 365/156 |
| 4,081,697 | 3/1978 | Nakano | 365/154 |

OTHER PUBLICATIONS

Mayumi et al, "A 25-ns Read Access Bipolar 1K bit TTL RAM", IEEE Journal of Solid-State Circuits, 10/74, pp. 283-284.
Berger et al, "Merged-Transistor Logic (MTL)-A Low-Cost Bipolar Logic Concept", IEEE Jour. of Solid-State Circuits, vol. SC-7, No. 5, 10/72, pp. 340-346.
Ayling, "Differential Signal Phase Sensing and Latching Detector", IBM Tech. Disc. Bul., vol. 14, No. 6, 11/71, p. 1674.
Cordaro et al., "Amoeba Sense Amplifier and Regenerator", IBM Tech. Disc. Bul., vol. 21, No. 4, 9/78, pp. 1479-1482.

*Primary Examiner*—Stuart N. Hecker
*Attorney, Agent, or Firm*—Stephen J. Limanek

[57] ABSTRACT

A sensing system is provided for a memory cell having first and second transistors with first and second diffusion capacitances, respectively, storing unequal amounts of charge which are coupled to first and second bit lines, respectively. The cell is preferably a four device integrated injection logic or merged transistor logic bipolar cell. The charges represent stored information and are maintained in a standby condition by maintaining a charge on the bit lines. When the information is to be sensed, the bit lines are discharged through the cell to enhance the charge difference in the diffusion capacitances. The charge now stored in the diffusion capacitances is transferred onto the bit lines and detected by a differential sensing circuit connected between the first and second bit lines to which are connected first and second equal valued resistors, respectively. The charge in the diffusion capacitances which results after enhancement may be transferred onto the bit lines by discharging the bit lines through the two resistors or by pulsing up the diffusion capacitances from a terminal remote from the bit lines to force the charge onto the bit lines.

14 Claims, 3 Drawing Figures

DIFFERENTIAL CHARGE SENSING SYSTEM

DESCRIPTION

1. Technical Field

This invention relates to highly integrated circuits, and more particularly to circuits for sensing charge in diffusion capacitances of a memory cell.

2. Background Art

The field of logical circuits with bipolar transistors has been marked by considerable progress in recent years, and, particularly under the term Merged Transistor Logic (MTL) or Integrated Injection Logic (I²L), has been referred to extensively in technical literature. Attention is drawn, for example, to the article in the *IEEE Journal of Solid-State Circuits*, Vol. SC-7, No. 5, October 1972, pp. 340 to 346. Relevant patents are, for example, commonly assigned U.S. Pat. No. 3,736,477, filed Apr. 14, 1971, and U.S. Pat. No. 3,816,758, filed Mar. 15, 1973. This injection logic concept is essentially based on inverting single- or multiple-collector transistors which are fed close to (order of magnitude of one diffusion length) their emitter-base junctions by the injection of minority charge carriers inside the semiconductor body.

A basic structure of this logic concept, which is marked by short switching times and which produces extremely highly integrated large scale circuits, as described in the aforementioned U.S. patents, includes a semiconductor layer of a first conductivity type zone serving as a base, with a second conductivity type serving as emitter and collector zones of a lateral transistor structure arranged spaced from each other by the base zone. In the collector zone of the lateral transistor structure at least one further zone of opposite or first conductivity type is arranged which serves as the collector zone of an inversely operated vertical, complementary transistor structure. The collector zone of the lateral transistor structure simultaneously forms the base zone of the vertical transistor structure. The base zone of the lateral transistor and the emitter zone of the inversely operated vertical transistor structure are formed by the semiconductor layer of the first conductivity type. For operating this semiconductor structure as a logical basic circuit, a load-independent current is impressed into the emitter zone of the lateral transistor structure, which as a function of the input signal applied to the collector zone of the lateral transistor and the base zone of the vertical transistor controls the current supplying the inverted output signal through the vertical transistor structure. By merging the zones of the same doping and connected to the same potential, a structure of optimum integration is obtained, the manufacture of which requires only two diffusion processes in the embodiment considered.

These inverting, logical basic circuits are, not only very suitable for the design of logical circuits, but are equally suitable as components for monolithically integrated storage cells. Such storage cells are used in particular in digital data processing systems. The storage cells are arranged in a matrix, so that via corresponding selection means each cell can be addressed separately, while data is written into or read from that cell.

It is known that inverting logical circuits require two stages to obtain storage cells in the manner of bistable multivibrators or flip-flops. Thus, a storage cell includes two such basic circuits which are symmetrically designed and whereby the output of one circuit is connected to the input of the other to provide a feedback condition. In this manner the necessary cross-coupling, as exists in the usual flip-flops, is obtained.

From commonly assigned U.S. Pat. No. 3,815,106, "Flip-Flop Memory Cell Arrangement" by Siegfried K. Wiedmann, issued June 4, 1974, a storage cell is known which includes two of the logical basic circuits described and in which the collector of the inverting transistor of one basic circuit is in each case connected to the base of the inverting transistor of the other basic circuit. The two inverting transistors are inversely operated, forming the actual flip-flop transistors. The complementary transistor of each basic circuit, via which the injection of minority charge carriers and thus the power supply is effected and which is connected via a separate line, serves as the load element for both flip-flop transistors.

By laterally arranging the two circuits to form one storage cell and by merging the zones connected to the same potential, a desired simple semiconductor structure is obtained. By means of this known storage cell a storage matrix can be realized in which the storage cells are arranged in horizontal rows and vertical columns.

Proceeding from the known inverting logical basic circuit, commonly assigned U.S. patent application Ser. No. 763,183, entitled, "Highly Integrated Inverting Circuit" by Siegfried K. Wiedmann, filed Jan. 27, 1977, now abandoned, relates to a correspondingly improved basic circuit which particularly because of its operation offers considerable advantages in connection with logical circuits and which by means of its sense circuit largely reduces the load imposed on the actual signal path. This is accomplished by sensing the conductive state of the inverting transistor of the basic I²L circuit with the aid of a sense circuit incorporated in the injection current circuit and thus in the operating current circuit. This sensing is effected as a function of the current reinjected into the injection zone with a conductive inverting transistor. When this principle is used in a circuit including two such circuits connected in the form of a flip-flop to serve as a storage cell, both the supply of the operating current and the coupling of the read/write signals is effected via bit lines connected to the injection zone. In this manner no separate addressing transistors are required, and additional injection zones required with known storage cells are eliminated. Although this technique for sensing the conductive state of the inverting transistor has been successful, the signal supplied on the injection zone as a result of charge carriers being reinjected by the conductive transistor may not be as strong as desired to provide a clearly defined storage cell read signal which can be rapidly detected.

U.S. Pat. No. 4,021,786, filed Oct. 30, 1975, illustrates a bipolar memory similar to that taught in the above identified U.S. patent application. The sensing technique disclosed therein merely teaches detecting the difference between the current and voltage characteristics of the emitter-base junctions of a saturated versus an unsaturated transistor.

Other sensing techniques are known, as follows: *IBM Technical Disclosure Bulletin*, Vol. 14, No. 6 November 1971, page 1674, discloses a simple cross-coupled sense latch; *IBM Technical Disclosure Bulletin*, Vol. 21, No. 4 September 1978, pages 1479–1482, discloses a sense amplifier for detecting signals from a cell wherein from a storage capacitor, i.e., the junction capacitance of the base-collector of a transistor of the cell, a charge flows onto the bit line and a cross-coupled latch connected to the bit lines amplifies the cell signals; and commonly assigned U.S. Pat. No. 4,027,176, filed on Nov. 26, 1975, by K. Heuber et. al. discloses a sense circuit wherein a storage cell connected to a pair of bit lines is coupled to a latch through a differential amplifier with an output driver connected to the latch.

Although the prior art sensing techniques satisfactorily detect signals produced in many memory cells, none of these sensing techniques provide the desired high performance for high density static bipolar random access memories utilizing I$^2$L or MTL circuits.

DISCLOSURE OF INVENTION

It is an object of this invention to provide an improved sensing system for high density static bipolar random access memories.

It is another object of this invention to provide an improved sensing system for bipolar random access memories having high performance.

It is still another object of this invention to provide a sensing system which realizes improved cell stability for memories utilizing I$^2$L or MTL circuits.

It is a further object of this invention to provide a sensing system which reduces adjacent cell read disturbs in a memory matrix utilizing I$^2$L or MTL circuits while substantially reducing access time.

It is yet another object of this invention to provide a high performance sensing system for memories utilizing four device I$^2$L or MTL cells.

In accordance with the teachings of this invention, a sensing system is provided for a memory cell having first and second transistors with first and second diffusion capacitances, respectively, storing unequal amounts of charge which are coupled to first and second bit lines, respectively. The charges represent stored information and are maintained in a standby condition by maintaining a charge on the bit lines. When the information is to be sensed, the bit lines are discharged through the cell to provide a significant charge difference in the diffusion capacitances. The charge now stored in the diffusion capacitances is transferred onto the bit lines and detected by a differential sensing circuit which is connected across two equal impedances connected to the first and second bit lines. The charge in the diffusion capacitances which produces the significant charge difference may be transferred onto the bit lines by discharging the bit line through the two impedances or by pulsing up the diffusion capacitance at a terminal remote from the bit lines.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
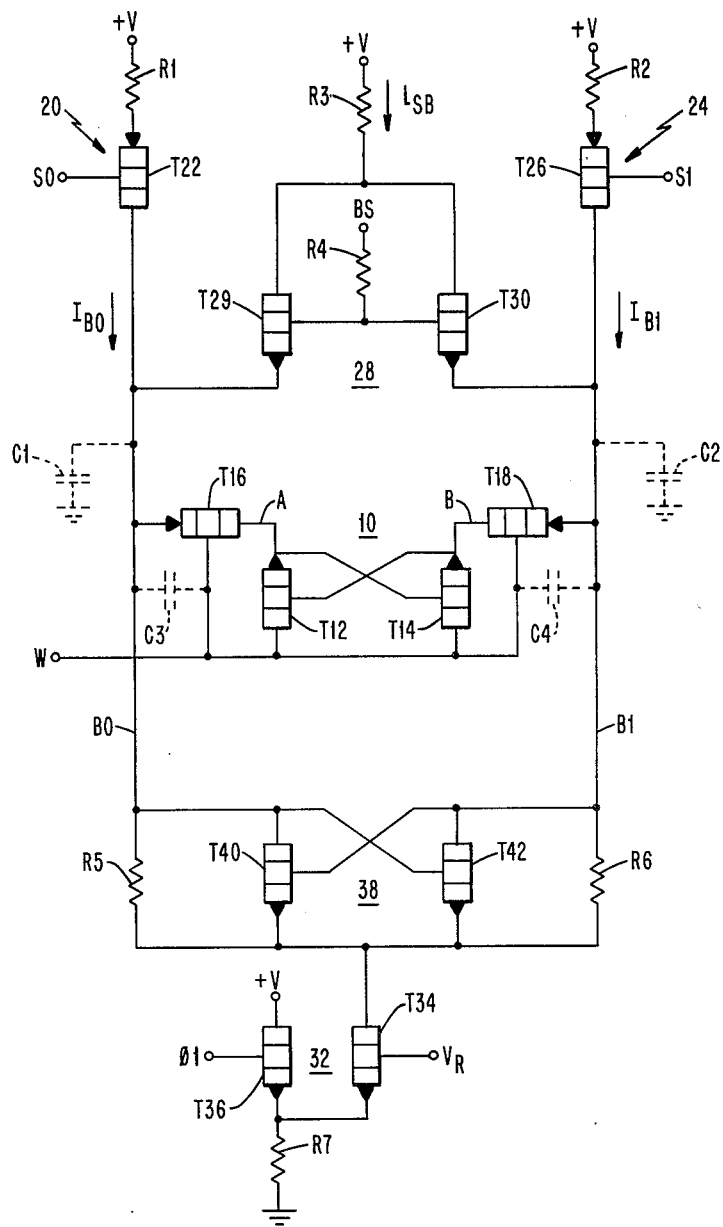
FIG. 1 is a circuit diagram illustrating the sensing system of the present invention coupled to an I$^2$L or MTL memory cell.

Referring to FIG. 1 of the drawing in more detail, there is illustrated a circuit diagram of the sensing system of the present invention coupled to a four device I$^2$L storage cell circuit 10. The cell circuit 10 includes a pair of cross-coupled NPN bipolar transistors T12 and T14. The emitter of each of the transistors T12 and T14 is connected to the base of the other transistors T12 and T14. The collectors are connected to a common point and to a word line terminal W. The cell circuit 10 also includes a first PNP transistor T16 having an emitter connected to a bit line B0, a collector connected to the emitter of transistor T12 forming a node A and a base connected to the collector of transistor T12, and a second PNP transistor T18 having an emitter coupled to a bit line B1, a collector connected to the emitter of transistor T14 forming node B and a base connected to the collector of transistor T14. The first and second PNP transistors T16 and T18 are preferably made in the form of lateral transistors and the cross-coupled pair of transistors T12 and T14 are preferably made as vertical transistors, as is well known in the art. The parasitic capacitance of bit line B0 is indicated as capacitor C1 and the parasitic capacitance of bit line B1 is indicated as capacitor C2. Furthermore, capacitors C3 and C4 represent the diffusion capacitance at the emitter-base junctions of PNP transistors T16 and T18, respectively.

A first switchable or gated current source 20 connected to bit line B0 includes a PNP transistor T22 with an input terminal S0 connected to the base of transistor T22 with load resistor R1 connected between a voltage source +V, which may be equal to 5 volts, and the emitter of transistor T22. A second gated current source 24 connected to bit line B1 includes a PNP transistor T26 having its base connected to an input terminal S1 and load resistor R2 connected between the voltage source +V and the emitter of transistor T26.

A bit switch circuit 28 is connected between the pair of bit lines B0 and B1. Bit switch circuit 28 includes first and second NPN transistors T29 and T30 each having an emitter connected to bit lines B0 and B1, respectively. A standby resistor R3 is connected between the voltage source +V and the collector of each of the transistors T29 and T30. A bit select terminal BS is connected to the base of each of the transistors T29 and T30 through a bit select resistor R4. A first bit line discharge resistor R5 is connected between bit line B0 and a current switch 32 and a second bit line discharge resistor R6 is connected between bit line B1 and current switch 32. Current switch 32 includes a first NPN transistor T34 having a collector connected to bit line discharge resistors R5 and R6, a base connected to a voltage reference terminal V$_R$ and an emitter connected to a point of reference potential, e.g., ground, through a current switch resistor R7. Current switch 32 also includes a second NPN transistor T36 having a collector connected to the voltage source +V, a base connected to a terminal $\phi$1 and an emitter connected to the point of reference potential through the current switch resistor R7. The voltage applied to the $\phi$1 terminal has a down value having a magnitude slightly less than the magnitude of the referenced voltage applied to the terminal V$_R$ and an up value having a magnitude only slightly higher than the magnitude of the voltage applied to terminal V$_R$.

A sense amplifier latch 38 is connected between the pair of bit lines B0 and B1. Latch 38 includes a pair of cross-coupled NPN transistors T40 and T42 having their emitters coupled to a common point at the collector of current switch transistor T34. The bases and collectors of the cross-coupled transistors T40 and T42 are cross-coupled to form the latch arrangement.

Figure 2:
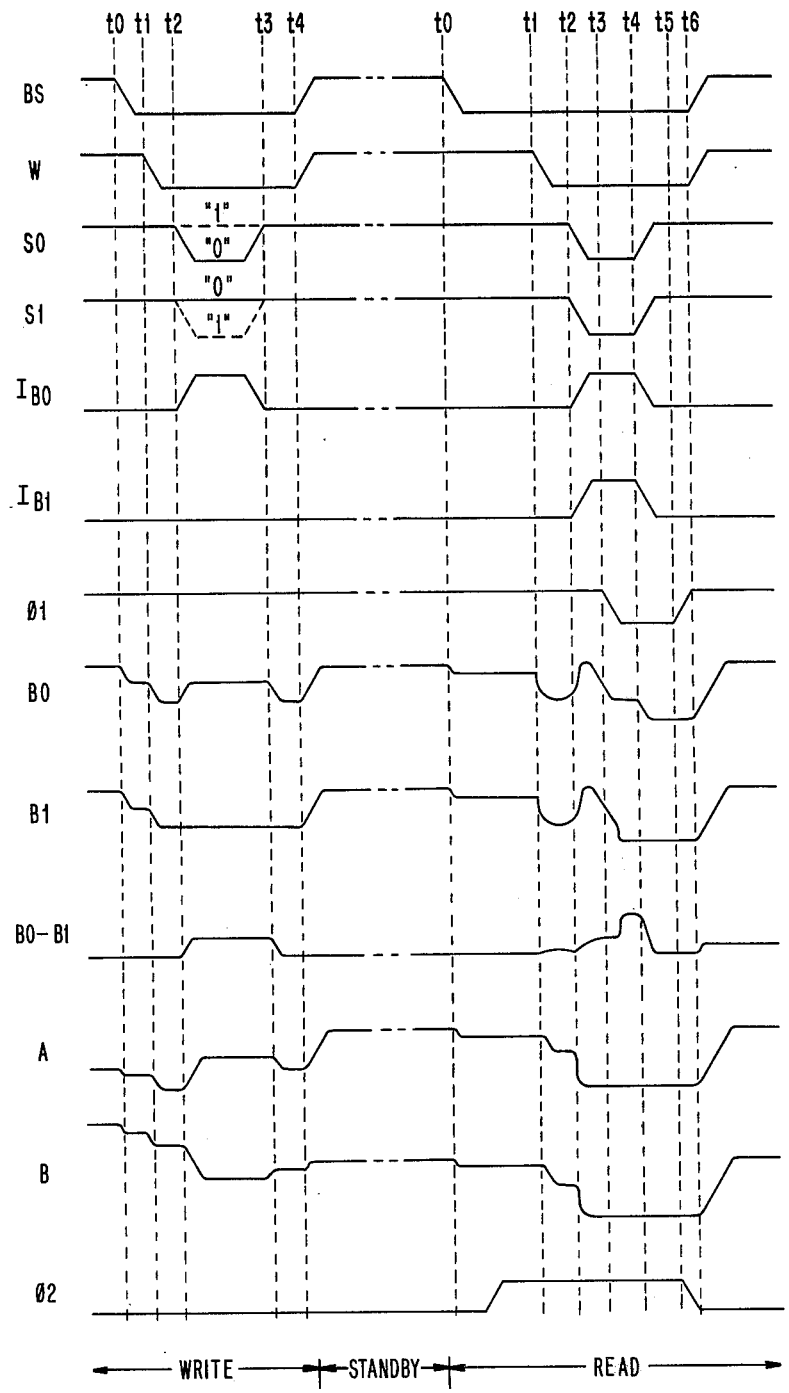
FIG. 2 is a pulse program which may be used to operate the system illustrated in FIG. 1 of the drawing.

In order to better understand the operation of the circuit of FIG. 1, reference may be had to the pulse program indicated in FIG. 2 of the drawing. Prior to writing information into the memory cell 10 transistors T22, T26 and T34 are off and the pair of bit lines B0 and B1 are charged only by the standby current $i_{SB}$ flowing through resistor R3 and transistors T29 and T30 which maintains the information previously stored in cell 10. Assume, for example, that a one binary digit of information was stored in cell 10 and that a zero binary digit of information is now to be written into cell 10. As indicated in FIG. 2 of the drawing the bit select pulse BS is turned off at time t0 which terminates the flow of standby current to the bit lines B0 and B1 causing a slight drop in voltage in lines B0 and B1 and at nodes A and B of cell 10. At time t1 the word line voltage W decreases which causes a further decrease in the voltage on line B0 and B1 as well as at nodes A and B. A control pulse is applied to the base of transistor T22 of the first current source 20 through the terminal S0 to increase the current $I_{B0}$ in the bit line B0 as indicated in FIG. 2 of the drawing between times t2 and t3 which causes the voltage on bit line B0 to increase along with the increase in voltage at node A while the voltage at node B continues to decrease. This change in voltage at nodes A and B causes the cross-coupled transistors T12 and T14 to flip so that now the zero bit of information is stored in cell 10 with transistor T12 being turned off and transistor T14 being turned on. At time t3 the control pulse at terminal S0 is increased to again turn off transistor T22 and at time t4 the word line voltage W and the bit select voltage BS are increased with the standby current being again supplied through standby resistor R3 through transistors T29 and T30 to bit lines B0 and B1 to maintain the 0 binary digit of information stored in cell 10. If it had been desired to store a 1 binary digit of information in cell 10, then a control pulse would have been applied to terminal S1 of transistor T26 of the second current source 24 to apply an increased current $I_{B1}$ to bit line B1. The cell 10 may now remain in its standby condition indefinitely with the 0 binary digit of information stored therein.

To read information from cell 10, reference may be had to the read portion of the cycle as indicated in FIG. 2 of the drawing. During time t0 of the read portion of the cycle the bit select pulse BS applied to the bit switch circuit at terminal BS is decreased to terminate the flow of standby current to the pair of bit lines B0 and B1 causing the voltage on bit lines B0 and B1 to decrease slightly as well as on nodes A and B. At time t1 the word line W is decreased which pulls down the voltage on bit lines B0 and B1, transferring charge from the bit lines into cell 10, while also pulling down the voltage on nodes A and B. This powering up of the cell causes a significant charge difference in the emitter-base diffusion capacitances C3 and C4 of transistors T16 and T18, respectively, due to back injection from the on transistor 14 of the cross-coupled pair T12 and T14. At time t2 transistor T22 of current source 20 and transistor T26 of current source 24 are turned on to cause an increase in currents $I_{B0}$ and $I_{B1}$ in the bit lines B0 and B1, respectively, which further powers cell 10 with current flowing through cell 10 into the word line at terminal W. The charge now stored in the diffusion capacitances C3 and C4 is applied to bit lines B0 and B1, respectively, by discharging the bit lines B0 and B1 through the bit line discharge resistors R5 and R6 by decreasing the voltage at $\phi 1$ terminal to turn on transistor T34 of the current switch S2. This process develops a difference voltage on the bit lines of about 20 millivolts which is sufficient to cause the sense amplifier latch 38 to regenerate the polarity of the signal as the current in T34 reaches $2 \times V_{be}/R5$, where $V_{be}$ is the base-emitter voltage of transistor T40. Up to this time the bit line difference voltage was determined by the cell 10 but now the regenerative action of the latch forces an increase of at least an order of magnitude in this difference voltage. Approximately 200 to 400 millivolts is achieved in the magnitude of this voltage and is indicated in FIG. 2 at the graph B0–B1. At time t4 PNP transistors T22 and T26 are turned off. At time t5 the $\phi 1$ pulse is turned off and at time t6 the bit select and word pulses BS and W, respectively, assume their upper value to place the memory cell again in its standby position to await further reading or to be rewritten.

It should be noted that in the prior art the sensing circuits for the four device I²L memory cells detected voltage differences between bit lines B0 and B1 of the order of 6 to 15 millivolts after an appreciable amount of time had elapsed. Whereas, in the sensing system of the present invention the diffusion capacitances C3 and C4 of cell 10 are powered up very rapidly by the current pulses $I_{B0}$ and $I_{B1}$ with the charge in diffusion capacitances C3 and C4 being quickly applied to bit lines B0 and B1 by discharging the bit lines through discharge resistors R5 and R6. The use of this technique allows freedom to choose the rate of build up of the difference voltage between bit lines B0 and B1 by setting the charge currents $I_{B1}$ and $I_{B0}$ and discharge currents in resistors R5 and R6, accordingly. This difference voltage is then speedily enhanced by the sense amplifier latch 38. The prior art sensing methods require about 25 nanoseconds to build up the bit line difference voltage to a detectable level whereas the method disclosed herein requires only about 10 nanoseconds. The voltage difference developed between bit lines B0 and B1 by sense amplifier latch 38 can be readily transferred to a data out latch, as will be described hereinbelow in connection with the circuit of FIG. 3.

It should be noted that the capacitors C3 and C4 are the diffusion capacitances of the base-emitter junctions of transistors T16 and T18 of cell 10 and are dependent on the currents flowing through transistors T16 and T18, with one of these currents being enhanced by back injection. The stored data is transferred by back injection to capacitors C3 and C4 as a differential charge. This charge may be derived as follows:

$$\Delta Q = C_o \int (I_{JE16} - I_{JE18}) dV = V_T C_o (I_{JE16} - I_{JE18})$$

where $V_T = (KT/q)$, K being Boltzman's constant, T being temperature in degrees Kelvin and q being charge on an electron, $C_o$ = constant and $I_{JE16}$ and $I_{JE18}$ are the total current in the emitter-base junctions of T16 and T18, respectively.

As stated hereinabove the data in the cell 10 is transferred to the bit lines by pulling down the bit lines through the bit line discharge resistors R5 and R6, however, if desired the data may be transferred to the bit lines by pulsing the word line W up to discharge the cell in a similar manner during the time interval that $\phi 1$ would be pulsed down.

Figure 3:
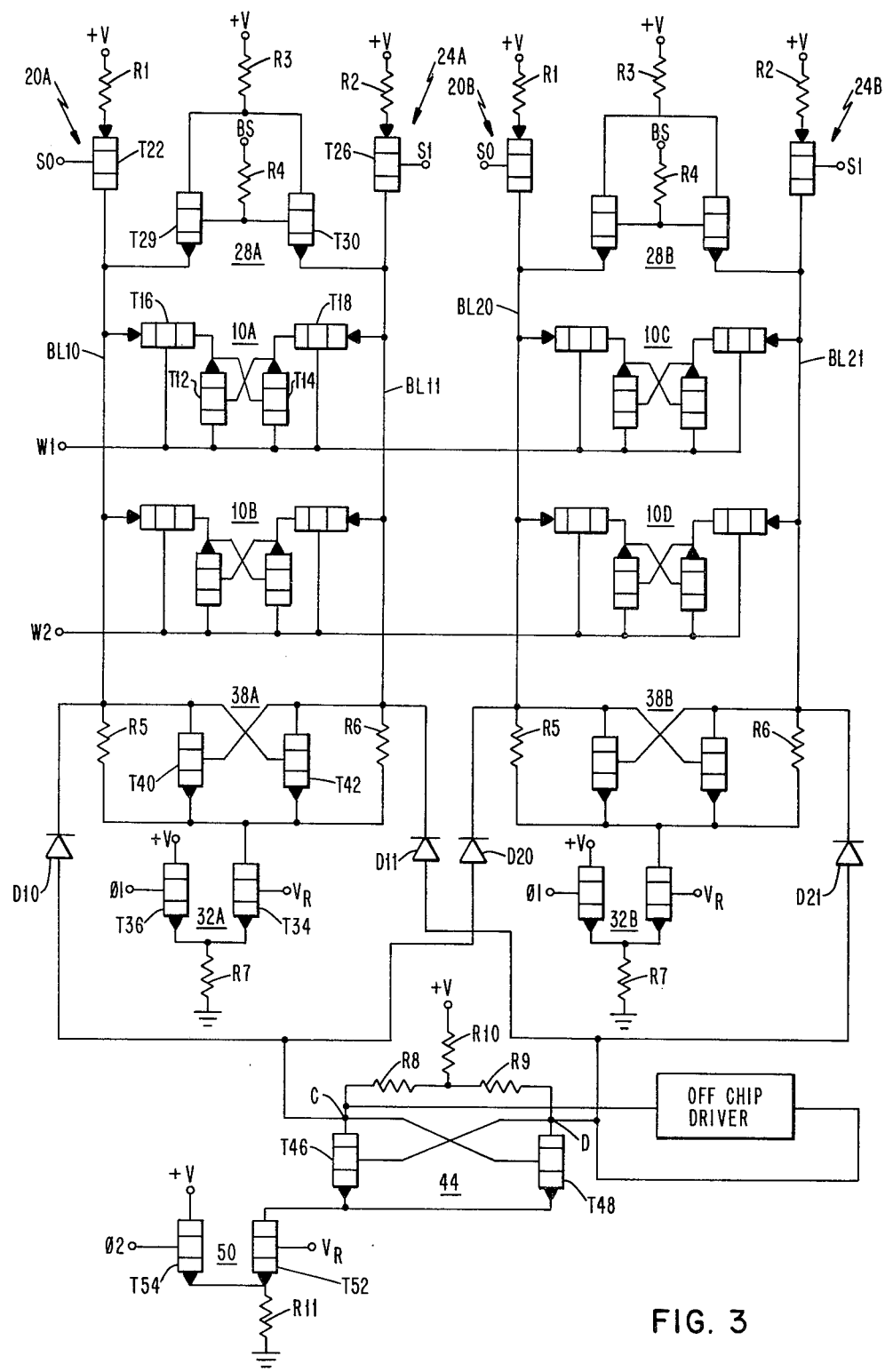
FIG. 3 illustrates an array of I$^2$L or MTL memory cells with the sensing system of the present invention coupled thereto.

FIG. 3 illustrates a matrix of I²L memory cells to which the sensing system of the present invention is coupled. The matrix of FIG. 3 of the drawing includes a first pair of bit lines BL10 and BL11 and second pair of bit lines BL20 and BL21. Coupled to the first pair of bit lines BL10 and BL11 are a first memory cell 10A and a second memory cell 10B, each of which is similar to memory cell 10 illustrated in FIG. 1 of the drawing. Also, connected between bit lines BL10 and BL11 are a bit switch circuit 28A and a sense amplifier latch 38A, the bit switch circuit 28A being similar to bit switch 28 illustrated FIG. 1 and the sense amplifier latch 38A being similar to the latch 38 also illustrated in FIG. 1 of the drawing. First and second current sources 20A and 24A are connected to bit lines BL10 and BL11, respectively. These current sources 20A, 24A are similar to the gated current sources 20 and 24 of FIG. 1 of the drawing. A current switch 32A, similar to current switch 32 of FIG. 1 is connected to bit lines BL10 and BL11 through bit line discharge resistors R5 and R6, respectively.

The second pair of bit lines BL20 and BL21 have connected thereto a memory cell 10C and a memory cell 10D. Also connected between bit lines BL20 and BL21 are a bit switch circuit 28B and a sense amplifier latch 38B. A current source 20B is connected to bit line BL20 and a current source 24B is connected to bit line BL21. A current switch 32B is connected to bit lines BL20 and BL21 through bit line discharge resistors R5 and R6 which are connected to bit lines BL20 and BL21, respectively.

A data out latch 44 includes a pair of cross-coupled transistors T46 and T48 with their emitters connected to a common point and the collector of each transistor being connected to the base of the other transistor. The collectors are also connected through resistors R8 and R9 to a common point which is connected to voltage source $+V$ through a current limiting resistor R10. A current switch 50 includes transistor T52, having its collector connected to the emitters of transistors T46 and T48, its base connected to a reference terminal $V_R$ and its emitter connected to a point of reference potential through a current switch resistor R11, and transistor T54 having its collector connected to the voltage source $+V$, its base connected to a terminal $\phi 2$ and its emitter connected to the emitter of transistor T52. The voltage $V_R$ at the base of transistor T52 may be similar to the voltage $V_R$ at the base of transistor T34 in current switch 32A and the magnitude of the voltage at terminal $\phi 2$ may be similar to the magnitude of the voltage applied to the terminal $\phi 1$ at the base of transistor T36 of the current switch 32A. A node C located at the collector of transistor T46 is connected to the left bit line of each pair of bit lines BL10, BL11 and BL20, BL21 through diodes D10 and D20, respectively. A node D at the collector of transistor T48 of data out latch 44 is connected to the right line of the two bit line pairs BL10, BL11 and BL20, BL21 through diodes D11 and D21, respectively.

A first word line W1 is connected to cell 10A of the first pair of bit lines BL10 and BL11 at the collector of the transistors T12 and T14 and to the cell 10C of the second pair of bit lines BL20 and BL21, and a second word line W2 is connected to memory cell 10B attached to the first bit line pair BL10 and BL11 and to memory cell 10D attached to the second pair of bit lines BL20 and BL21.

An off chip driver, which may be of any suitable type, is connected to nodes C and D of the data out latch.

In the operation of the memory matrix illustrated in FIG. 3 of the drawing any one cell may be selected by selecting the appropriate pair of bit lines and the appropriate word line. For example, cell 10A may be selected by selecting the first bit line pair BL10 and BL11 and word line W1. The write, standby and read portions of the cycle for operating cell 10A are then similar to those used in the operation of cell 10 illustrated in FIG. 1 of the drawing. However, during the standby condition of the memory cells 10A, 10B, 10C and 10D, the data out latch 44 may store the information from the previously read out cell. The information stored in data out latch 44 is destroyed by increasing the voltage $\phi 2$, as indicated in FIG. 2 of the drawing, prior to reading a selected cell. The new information is then applied to latch 44 and stored therein by decreasing the voltage $\phi 2$ at time t5 of the read portion of the cycle.

It should be noted that all bit lines may be ORed to nodes C and D of data out latch 44 through diodes D10, D11, D20 and D21. This arrangement provides the necessary isolation for the bit lines, minimizes the capacitive loading on the data out latch and supplies power to the sense amplifier latches.

It should also be noted that although only four memory cells have been illustrated in the memory matrix of FIG. 3 of the drawing, many more cells may be used, e.g., 100 or more memory cells may be connected to each pair of bit lines and each word line may be connected to one hundred or more cells.

It should be understood that all unselected bit line pairs in the memory matrix are discharged by any suitable means prior to word line selection, as is well known.

While the invention has been particularly shown and described with reference to preferred embodiments thereof, it will be understood by those skilled in the art that various changes in form and details may be made therein without departing from the spirit and scope of the invention.

What is claimed is:

1. A sensing system for memory cell having first and second transistors with first and second diffusion capacitances, respectively, carrying unequal amounts of currents resulting in a charge difference in said diffusion capacitances indicative of stored data comprising:
   first and second bit lines connected to said first and second diffusion capacitances, respectively;
   means for maintaining said data in said cell;
   means for increasing the charge in said first and second diffusion capacitances;
   first and second impedances having equal magnitudes connected to said first and second bit lines, respectively;
   means including voltage varying means coupled to said first and second impedances for transferring said increased charge in said diffusion capacitance through said first and second impedances; and
   means for sensing a resulting voltage difference across said first and second impedances.

2. A sensing system as set forth in claim 1 wherein said charge increasing means includes first and second current sources connected to said first and second bit lines, respectively.

3. A sensing system as set forth in claim 1 further including first and second charged capacitances coupled to said first and second bit lines, respectively, and wherein said charge increasing means includes means for transferring charge from said first and second charged capacitances to said first and second diffusion capacitances, respectively.

4. A sensing system as set forth in claim 1 further including first and second charged capacitances coupled to said first and second bit lines, respectively, and wherein said charge increasing means includes first and second current sources connected to said first and second bit lines, respectively, and means for transferring charge from said first and second charged capacitances to said first and second diffusion capacitances, respectively.

5. A sensing system as set forth in claim 1 wherein said first and second impedances are first and second resistors.

6. A sensing system as set forth in claim 1 wherein said maintaining means includes means for equalizing the potential on said first and second bit lines.

7. A sensing system as set forth in claim 1 wherein said sensing means includes a sensing latch and said first and second transistors are PNP transistors each having an emitter connected to a different one of said first and second bit lines.

8. A sensing system as set forth in claim 7 wherein said sensing latch includes a pair of cross-coupled transistors coupled between said first and second bit lines.

9. A sensing system for a memory cell having first and second transistors with first and second diffusion capacitances, respectively, carrying unequal amounts of current resulting in a charge difference in said diffusion capacitances indicative of stored data comprising:
first and second bit lines connected to said first and second diffusion capacitances, respectively, said first and second bit lines having first and second charged capacitances, respectively;
means for maintaining said data in said cell including means for equalizing the potential on said first and second bit lines;
means for increasing the charge in said first and second diffusion capacitances including first and second current sources connected to said first and second bit lines, respectively, and means for transferring charge from said first and second charged capacitances to said first and second diffusion capacitances, respectively;
first and second resistors having equal magnitudes connected to said first and second bit lines, respectively;
means for transferring said increased charge in said diffusion capacitances through said first and second resistors, said transferring means including a current switch coupled to said first and second impedances; and
means for sensing the resulting voltage difference across said first and second resistors, said sensing means including a sensing latch having a pair of cross-coupled transistors connected between said first and second bit lines.

10. A sensing system for a memory cell having first and second transistors with first and second diffusion capacitances, respectively, carrying unequal amounts of current indicative of stored data comprising:
first and second bit lines connected to said first and second diffusion capacitances, respectively;
means connected to said bit lines for charging up said bit lines to maintain said data in said cells;
means for discharging said charged bit lines through said cell to provide a significant charge difference in said first and second diffusion capacitances;
means including voltage varying means for transferring said charge difference in said diffusion capacitances to said bit lines; and
means for sensing the charge difference on said bit lines.

11. An integrated semiconductor system comprising:
first and second bit lines;
a memory cell including a pair of cross-coupled NPN transistors and first and second PNP transistors, said first PNP transistor being connected between said first bit line and said cross-coupled NPN transistors and said second PNP transistor being connected between said second bit line and said cross-coupled NPN transistors;
first and second gated current sources connected to said first and second bit lines, respectively;
gated circuit means connected between said first and second bit lines for maintaining data in said memory cell;
first and second resistors connected to said first and second bit lines, respectively;
means coupled to said first and second bit lines through said first and second resistors for selectively varying the voltage at said resistors; and
a sense amplifier latch connected between said first and second bit lines, said sense amplifier latch including a pair of cross-coupled bipolar transistors.

12. An integrated semiconductor system comprising:
a plurality of pairs of bit lines;
a plurality of memory cells connected between each pair of said lines, each of said cells having first and second transistors, each having first and second diffusion capacitances connected to said bit lines carrying unequal amounts of currents resulting in a charge difference in said diffusion capacitances indicative of stored data;
means coupled to each pair of said plurality of pairs of bit lines for maintaining said data in said cells;
means for increasing the charge in the first and second diffusion capacitances of a selected cell;
a plurality of first and second impedances having equal magnitudes connected to said pairs of bit lines;
means for transferring said increased charge in the diffusion capacitances of said selected cell through said first and second impedances coupled to said selected cell;
a pair of common nodes;
means coupled to said pair of common nodes through diodes for sensing a resulting voltage difference developed across the first and second impedances coupled to said selected cell; and
data out latching means coupled to said pair of common nodes and to said sensing means.

13. A sensing system for a memory cell having first and second transistors with first and second diffusion capacitances, respectively, carrying unequal amounts of currents resulting in a charge difference in said diffusion capacitances indicative of stored data comprising:
first and second bit lines connected to said first and second diffusion capacitances, respectively;
means for maintaining said data in said cell;

means for increasing the charge in said first and second diffusion capacitances;

first and second impedances having equal magnitudes connected to said first and second bit lines, respectively;

means including a gated current source coupled to said first and second impedances for transferring said increased charge in said diffusion capacitances through said first and second impedances; and means for sensing a resulting voltage difference across said first and second impedances.

14. An integrated semiconductor system comprising:

a plurality of pairs of bit lines;

a plurality of memory cells connected between each pair of said lines, each of said cells having first and second transistors, each having first and second diffusion capacitances connected to said bit lines carrying unequal amounts of currents resulting in a charge difference in said diffusion capacitances indicative of stored data;

means coupled to each pair of said plurality of pairs of bit lines for maintaining said data in said cells;

means for increasing the charge in the first and second diffusion capacitances of a selected cell;

a plurality of first and second impedances having equal magnitudes connected to said pairs of bit lines;

means for transferring said increased charge in the diffusion capacitances of said selected cell through said first and second impedances coupled to said selected cell, said transferring means including voltage varying means connected to the first and second impedances coupled to said selected cell;

means for sensing a resulting voltage difference developed across the first and second impedances coupled to said selected cell; and data out latching means coupled to said sensing means.

* * * * *